(12) United States Patent
Dadgar et al.

(10) Patent No.: US 12,494,365 B2
(45) Date of Patent: Dec. 9, 2025

(54) METHOD FOR GROWING A SEMICONDUCTOR ASSEMBLY AND SEMICONDUCTOR ASSEMBLY

(71) Applicant: OTTO-VON-GUERICKE-UNIVERSITÄT MAGDEBURG, Magdeburg (DE)

(72) Inventors: Armin Dadgar, Magdeburg (DE); Florian Hörich, Magdeburg (DE)

(73) Assignee: OTTO-VON-GUERICKE-UNIVERSITÄT MAGDEBURG, Magdeburg (DE)

( * ) Notice: Subject to any disclaimer, the term of this patent is extended or adjusted under 35 U.S.C. 154(b) by 213 days.

(21) Appl. No.: 18/022,052

(22) PCT Filed: Aug. 17, 2021

(86) PCT No.: PCT/EP2021/072776
§ 371 (c)(1),
(2) Date: Feb. 17, 2023

(87) PCT Pub. No.: WO2022/038108
PCT Pub. Date: Feb. 24, 2022

(65) Prior Publication Data
US 2023/0360908 A1 Nov. 9, 2023

(30) Foreign Application Priority Data
Aug. 19, 2020 (DE) .................... 10 2020 121 750.1

(51) Int. Cl.
*H01L 21/02* (2006.01)
(52) U.S. Cl.
CPC .. *H01L 21/02458* (2013.01); *H01L 21/02252* (2013.01); *H01L 21/02505* (2013.01); *H01L 21/0254* (2013.01); *H01L 21/02631* (2013.01)

(58) Field of Classification Search
CPC ......... H01L 21/02252; H01L 21/02631; H01L 21/02458; H01L 21/02505; H01L 21/0254;
(Continued)

(56) References Cited

U.S. PATENT DOCUMENTS

| 7,115,896 B2 | 10/2006 | Guo et al. |
| 2004/0119063 A1 | 6/2004 | Guo et al. |

(Continued)

FOREIGN PATENT DOCUMENTS

DE  10392313 T5  10/2005

OTHER PUBLICATIONS

Jiang, Effect of H2 on Microstructures and Properties of AlN Films Deposited by Reactive Magnetron Sputtering, 2013, Advanced Materials Research 750-752:1883-1886. (Year: 2013).*

(Continued)

*Primary Examiner* — Ajay Ojha
*Assistant Examiner* — Sandra Milena Rodriguez Villanu
(74) *Attorney, Agent, or Firm* — REISING ETHINGTON, P.C.

(57) ABSTRACT

The disclosure relates to a method for growing a semiconductor assembly. The method includes the steps of providing a silicon substrate and growing two metal nitride layers, each metal nitride layer being grown by means of a metal target and a plasma. For the second metal nitride layer a higher hydrogen content is used, allowing for better crystal quality than in known methods. The disclosure further relates to a semiconductor assembly that is produced accordingly.

19 Claims, 2 Drawing Sheets

Figure 1:
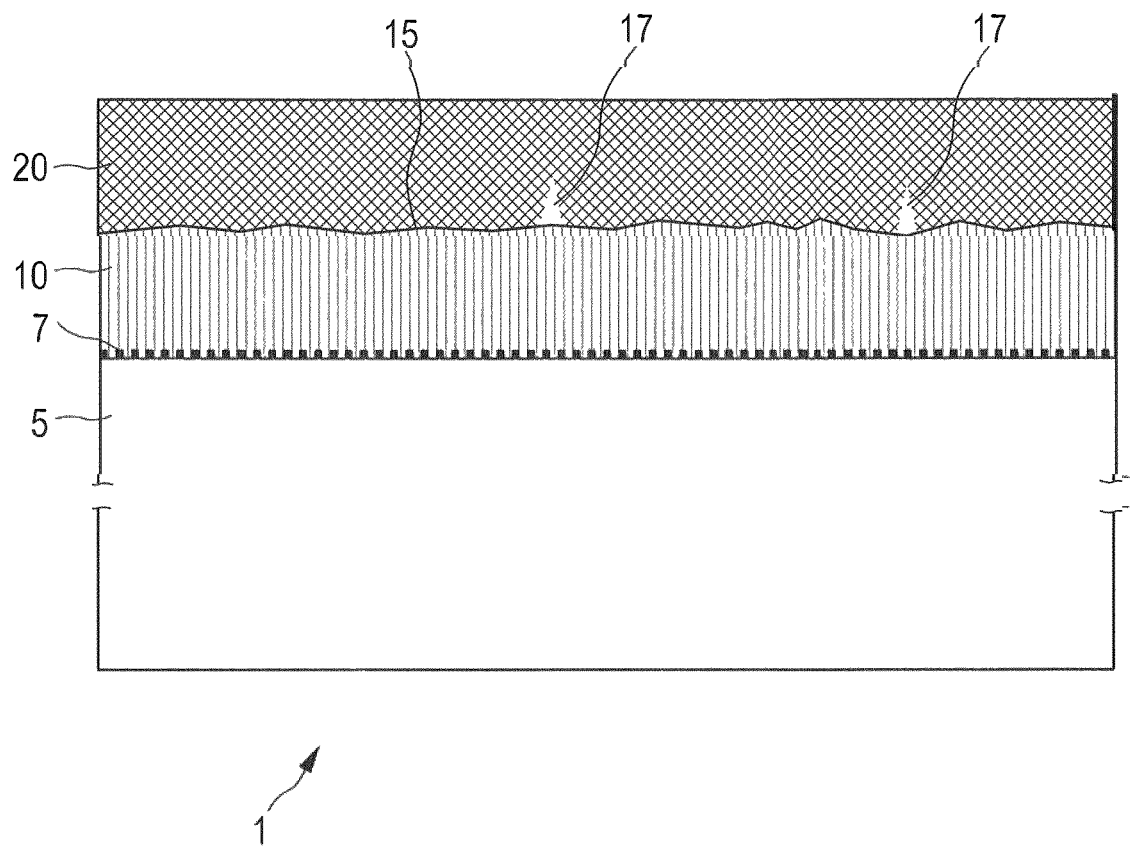

(58) Field of Classification Search
CPC ....... C30B 25/06; C30B 25/165; C30B 29/40; C30B 29/403
See application file for complete search history.

(56) References Cited

U.S. PATENT DOCUMENTS

| | | |
|---|---|---|
| 2006/0154455 A1 | 7/2006 | Guo et al. |
| 2011/0001163 A1 | 1/2011 | Sasaki et al. |
| 2011/0062016 A1 | 3/2011 | Araki et al. |
| 2011/0163349 A1* | 7/2011 | Sakai ................. H01L 21/0262 438/46 |
| 2017/0365512 A1* | 12/2017 | Swenberg ......... H01L 21/76843 |
| 2019/0051516 A1 | 2/2019 | Lee et al. |

OTHER PUBLICATIONS

Miyazaki Takayuki et al., "Properties of radio-frequency-sputter-deposited—GaN films in a nitrogen/hydrogen mixed gas", Journal of Applied Physics, American Institute of Physics, US, vol. 97, No. 9, Apr. 20, 2005 (Apr. 20, 2005), pp. 93516-093516, ISSN: 0021-8979, XP012071183.

Jiang, C. [u.a.]: Effect of H2 on Microstructures and Properties of AlN Films Deposited by Reactive Magnetron Sputtering. In: Advanced Materials Research, vols. 750-752, 2013, S. 1883-1886.

Izyumskaya, N. [u.a.]: Emerge of high quality sputtered III-nitride semiconductors and devices. In: Semicond. Sci. Technol., vol. 34, 2019, 093003.

Hörich Florian et al., "Demonstration of lateral epitaxial growth of AlN on Si (111) at low temperatures by pulsed reactive sputter epitaxy", Journal of Crystal Growth, Amsterdam, NL, vol. 571, Jul. 2021, p. 126250.

International Search Report for International Application No. PCT/EP2021/072776 dated Nov. 19, 2021 (4 pages).

English Translation of International Search Report for International Application No. PCT/EP2021/072776 dated Nov. 19, 2021 (3 pages).

* cited by examiner

METHOD FOR GROWING A SEMICONDUCTOR ASSEMBLY AND SEMICONDUCTOR ASSEMBLY

The invention relates to a method for growing a semiconductor assembly, and to a semiconductor assembly which has been grown by means of such a method.

Semiconductor assemblies typically have one or more semiconductor layers in which semiconductor components such as transistors, solar cells, light-emitting diodes or diodes can be formed. By way of example, semiconductor layers of this type can be formed from silicon or from compound semiconductors, with a particularly high crystal quality being of crucial importance for numerous components. As a result, the performance of a semiconductor component can be improved or the reject rate during production can be reduced. It is possible for example to use metal nitride layers such as AlGaInN to produce components such as light-emitting diodes or power transistors. In known procedures, such layers are grown for example by means of metal-organic gas phase epitaxy (for example MOVPE=metal-organic vapor phase epitaxy or MOCVD=metal-organic chemical vapor deposition). Recently, the use of sputtering methods to produce semiconductor layers of this type has also been considered. However, it has been found that correspondingly produced layers are typically of poor quality when method regimes known from the prior art are used.

It is therefore an object of the invention to provide a method for growing a semiconductor assembly, which method is implemented in an alternative or better way compared to known methods. It may enable a higher crystal quality, for example. It is additionally an object of the invention to provide a semiconductor assembly which has been produced by means of such a method.

This is achieved according to the invention by a method and a semiconductor assembly according to the respective main claims. Advantageous configurations can be inferred for example from the respective dependent claims. The content of the claims is incorporated in the content of the description by express reference.

The invention relates to a method for growing a semiconductor assembly. The method comprises the following steps:
providing a silicon substrate,
growing a first metal nitride layer on the silicon substrate by way of plasma-assisted atomization by means of at least one metal target and a first plasma which is generated by supplying a first gas feed comprising at least nitrogen, and
growing a second metal nitride layer directly on the first metal nitride layer by way of plasma-assisted atomization by means of at least one metal target and a second plasma which is generated by supplying a second gas feed comprising at least nitrogen or ammonia,
wherein the second gas feed has a higher ratio of hydrogen atoms to nitrogen atoms than the first gas feed.

Such a method makes it possible to achieve particularly high crystal quality. This is expressed in particular in a particularly smooth surface of the second metal nitride layer, which is typically not used directly for the formation of components but serves as a base for one or more layers to be further grown thereon, which layers can be grown with a particularly high crystal quality on account of the particularly smooth surface of the second metal nitride layer.

The silicon substrate may for example be a silicon wafer which may in particular have a defined surface orientation on which the first metal nitride layer may be grown. Either the first metal nitride layer may be grown directly on the silicon substrate or at least one further layer may also be grown before the first metal nitride layer. This at least one further layer may in particular be the metal layer described further down, as a result of which, in typical situations, crystal quality can be improved even further. In principle, growing the first metal nitride layer on the silicon substrate is therefore understood here to mean both direct and indirect growth, with indirect growth meaning that at least one other layer, for example a metal layer, is first grown and then the first metal nitride layer is grown thereon.

In contrast, direct growth does not involve a further layer in between.

A metal target may in particular be a body which is formed from the metal to be used or from multiple metals to be used. In plasma-assisted atomization, the metal target is typically hit by particles such as atoms, ions, photons or electrons, and metal atoms are removed, at least some of which then typically fly to the silicon substrate or to a location at which they are to be deposited. For this purpose, plasma-assisted atomization is typically performed in an atmosphere in which a mean free path length is at least approximately the same as the distance between metal target and silicon substrate, so that the plasma-assisted atomization can be performed efficiently. For this purpose, the plasma-assisted atomization is typically performed under vacuum or high vacuum conditions. It may in particular be performed in a vacuum chamber.

The first plasma may in particular be generated adjacent to one metal target, or it may also be generated adjacent to multiple metal targets. Generation at other locations is also possible, however. By way of example, an electrically conductive ring or some other electrically conductive element can be arranged in the vicinity of a metal target and be connected to ground or to another potential. A voltage can then be applied between the metal target and the electrically conductive element, this leading to a gas discharge. The plasma can be generated as a result, with supplied gases typically being at least partially ionized.

Plasma-assisted atomization may in particular be sputtering or a sputtering process. This typically releases metal ions from the metal target by way of ion bombardment. In particular, it is possible to use magnetron sputtering. As an alternative or in addition, electron bombardment or laser bombardment may for example be used. In addition to a sputtering method or sputtering, it is for example also possible to use pulsed laser deposition or pulsed laser epitaxy or other metal-atomizing methods that work with a reactive atmosphere.

A gas feed is in particular understood to mean a totality of gases supplied during a specific process step. These gases may for example each be supplied separately, or they may be combined completely or at least partially in a gas stream containing multiple gases. A gas is in particular understood here to mean a gas having uniform chemistry, i.e. for example nitrogen, hydrogen or ammonia or a noble gas. In particular, an overall partial pressure of at least 3 Pa and/or at most 5 Pa, at most 7 Pa or at most 100 Pa, or for example of 5 Pa, of the supplied gases may be used.

Nitrogen atoms are in particular supplied in both gas feeds, particularly by way of molecular nitrogen or ammonia. In addition, hydrogen atoms in particular are supplied in the second gas feed, particularly as molecular hydrogen or as a constituent of ammonia, in order to be able to achieve the specified ratio of hydrogen atoms to nitrogen atoms which is at least greater than zero.

The same as was just detailed for the first plasma applies in principle to the second plasma. The second gas feed is typically different than the first, in that a higher proportion of hydrogen or hydrogen atoms is typically present in the second gas feed.

It has been found that growing the first metal nitride layer before growing the second metal nitride layer, where the first metal nitride layer is grown with a lower proportion of hydrogen, makes it possible to achieve significantly better crystal quality than if the second metal nitride layer is grown immediately with its comparatively high proportion of hydrogen.

For the hydrogen atoms, the determination of the ratio is based in principle on the atoms, regardless of whether they are supplied as hydrogen molecules, as a constituent of other molecules, in particular ammonia, or in ionized form.

What is ultimately relevant is how many hydrogen atoms, in whatever form, are introduced into a vacuum chamber or into some other vessel in which the method is performed. The same applies to the nitrogen atoms, which may be supplied for example as nitrogen molecules or else as a constituent of ammonia or other molecules or in ionized form.

By way of example, the ratio of hydrogen atoms to nitrogen atoms when growing the second metal nitride layer, i.e. in the second gas feed, compared to the growing of the first metal nitride layer, i.e. in the first gas feed, may be exactly or at least half as high again, twice as high, three times as high, four times as high, five times as high, ten times as high, twenty times as high, thirty times as high, fifty times as high or one hundred times as high. According to one embodiment, it is also possible to completely dispense with the use of hydrogen when growing the first metal nitride layer, so that for example exclusively nitrogen is supplied in the first gas feed. In this case, the ratio of hydrogen atoms to nitrogen atoms in the first gas feed is zero. A higher ratio is then already obtained in the second gas feed in that hydrogen is supplied at all, for example as molecular hydrogen or as a constituent of ammonia or other molecules.

The ratio of hydrogen atoms to nitrogen atoms when growing the second metal nitride layer may in particular be at least 1, at least 2, at least 3 or at least 5. Increasing the ratio at the transition from the first metal nitride layer to the second metal nitride layer is in particular a deliberate variation of a process parameter and should therefore be distinguished from unintentional process fluctuations.

According to one embodiment, before the growing of the first metal nitride layer, the method may comprise the following step:

growing a metal layer directly on the silicon substrate by way of plasma-assisted atomization by means of at least one metal target.

The first metal nitride layer is then typically grown directly on the metal layer. In particular, it may be grown in a non-reactive atmosphere.

Such a procedure makes it possible to improve crystal quality even further, as has been shown in experiments. The metal layer is therefore grown directly, i.e. immediately, on the silicon substrate and serves as a nucleation layer for the first metal nitride layer. This enables better crystal quality, i.e. in particular lower roughness, of the first metal nitride layer, which in turn enables better crystal quality of the second metal nitride layer grown thereon. Directly growing a layer on another layer is in particular understood to mean that no other layer is grown between the two layers, i.e. they are directly adjacent to one another. This relates in particular to growth that is caused deliberately, taking no account of any unavoidable chemical reactions which lead to discernible transitions.

The metal layer may in particular have a thickness of at least 0.05 nm or at least 0.2 nm. The metal layer may in particular have a thickness of at most 0.4 nm or at most 1 nm. Such values have been found to be advantageous, but it is also possible to use other thicknesses.

In particular, the metal layer may have a thickness of one monolayer. This has been found to be particularly advantageous since this enables complete coverage of the silicon substrate at least in the relevant region and provides a nucleation layer with minimum layer thickness.

The metal layer may in particular be grown as an aluminum layer or as a titanium layer. Aluminum or titanium have been found to be advantageous for typical applications. However, also possible is a combination of these two metals or else the use of other metals or combinations of metals.

A metal layer may in particular be grown in a period of at most 1 s, at most 2 s, at most 5 s or at most 10 s. This makes it possible to achieve the low layer thicknesses that are typically desired.

According to one embodiment, the first gas feed comprises nitrogen and hydrogen. The stoichiometric ratio between hydrogen atoms and nitrogen atoms is then advantageously at most 0.2, at most 0.15 or at most 0.1. There is therefore a low proportion of hydrogen, which also results in a correspondingly low proportion of hydrogen in the plasma. This low proportion of hydrogen may in particular result in an increase in the mobility of metal atoms on the surface in a direction parallel to the surface, whereby more uniform crystal growth is achieved. At the same time, the stated ratios between hydrogen atoms and nitrogen atoms are still small enough to avoid any possible occurrence of promotion of formation of metal-silicon alloys that might otherwise occur.

According to one embodiment, the first gas feed comprises nitrogen but no hydrogen. In other words, the supply of hydrogen, which may refer in particular both to molecular hydrogen and to hydrogen atoms as a constituent of other molecules or in ionized form, is dispensed with.

In particular, in such an embodiment, the first gas feed may comprise only nitrogen or only nitrogen and one or more noble gases. As a result, the effect of the hydrogen that might otherwise occur, that of promoting the formation of metal-silicon alloys, is completely prevented.

According to one embodiment, the second gas feed comprises ammonia. This means a simultaneous inflow of nitrogen atoms and hydrogen atoms in just one molecule, with the use of nitrogen having been found to be advantageous for the growth of the second metal nitride layer.

According to one embodiment, the second gas feed comprises nitrogen and hydrogen. This allows the ratio between nitrogen atoms and hydrogen atoms to be set freely. In this case, the stoichiometric ratio between hydrogen atoms and nitrogen atoms may in particular be at least 0.2, at least 0.5, at least 1, at least 2, at least 3 and/or at most 3 or at most 4. It has been found that good crystal quality is achieved in this range of values. Each lower value mentioned can be combined with each upper value mentioned to form an interval which represents a preferred range.

According to one embodiment, the second gas feed comprises nitrogen, ammonia and hydrogen. This enables an additional supply of nitrogen and hydrogen in addition to the ammonia. In this case, the stoichiometric ratio between hydrogen atoms and nitrogen atoms may in particular be at least 0.2, at least 0.5, at least 1, at least 2, at least 3 and/or at most 3 or at most 4. Each lower value mentioned can be combined with each upper value mentioned to form an interval which represents a preferred range.

According to one embodiment, the first gas feed comprises no further gas, in particular other than that or those specified. In particular, said first gas feed may therefore comprise only nitrogen or only nitrogen and hydrogen. According to one embodiment, the first gas feed further comprises only one or more noble gases. By way of example, argon, neon or another noble gas or a combination of noble gases may be provided. They may in particular form a constituent of the first plasma so that the plasma-assisted atomization is facilitated.

According to one embodiment, the second gas feed comprises no further gas, in particular other than that or those specified. In particular, said second gas feed may therefore comprise only ammonia, only ammonia and hydrogen, only ammonia, nitrogen and hydrogen or only nitrogen and hydrogen. According to one embodiment, the second gas feed further comprises only one or more noble gases. By way of example, argon, neon or another noble gas or a combination of noble gases may be provided. They may in particular form a constituent of the second plasma so that the plasma-assisted atomization is facilitated.

For the second gas feed, the stoichiometric ratio between hydrogen atoms and nitrogen atoms, independently of the gases used, may in particular be at least 0.2, at least 0.5, at least 1, at least 2, at least 3 and/or at most 3 or at most 4.

Each lower value mentioned can be combined with each upper value mentioned to form an interval which represents a preferred range.

The first metal nitride layer is preferably grown with a thickness of at least 3 nm, at least 5 nm, at least 10 nm or at least 20 nm. The first metal nitride layer is preferably grown with a thickness of at most 50 nm, at most 75 nm, at most 100 nm, at most 125 nm or at most 150 nm.

Such thicknesses have been found to be advantageous for typical applications since they can be grown in a short time and ensure good crystal quality.

The second metal nitride layer is preferably grown with a thickness of at least 10 nm, at least 100 nm or at least 1 μm. The second metal nitride layer is preferably grown with a thickness of at most 100 nm, at most 1 nm, at most 1 μm or at most 2 μm. Such thicknesses have been found to be advantageous for the second metal nitride layer since a particularly smooth surface is achieved and excessive enlargement of the layer construction is nevertheless avoided.

In particular, one or more further semiconductor layers may be grown directly onto the second metal layer. These further semiconductor layers may for example be gallium nitride layers or aluminum gallium nitride layers. Other semiconductor layers, particularly compound semiconductor layers, may also be grown thereon. Semiconductor layers of this type then benefit from the particularly smooth surface of the second metal nitride layer, which can be realized in embodiments of the method according to the invention.

In particular, the metal used for the first metal nitride layer may be aluminum, titanium, a transition metal, a group III element or a combination of two or more of these metals. In particular, it is thus possible to use only one metal for the first metal nitride layer, for example aluminum or titanium, or else a combination of two or more metals may be used.

In particular, the metal used for the second metal nitride layer may be aluminum, titanium, a transition metal, a group III element or a combination of two or more of these metals. In particular, it is thus possible to use only one metal for the second metal nitride layer, for example aluminum or titanium, or else a combination of two or more metals may be used.

The silicon substrate may in particular be provided in oxide-free and/or hydrogen-terminated form. As a result, a particularly high quality of the layers to be grown, i.e. in particular of the metal layer, of the first metal nitride layer and/or of the second metal nitride layer, is achieved. For example, an oxide may be avoided by means of a baking operation. Hydrogen termination may for example be achieved with an HF dip in hydrofluoric acid, whereby an oxidation can also be prevented. In particular, the silicon substrate may be heated in a vacuum, especially under a hydrogen-containing plasma, so that the hydrogen termination is preserved. Then it is possible for example to start with the growth of the first metal nitride layer or of the metal layer.

The silicon substrate may in particular be heated during the growing to a temperature of at least 500° C., at least 700° C., at least 800° C. and/or at most 1000° C. This may be effected in particular while growing the metal layer, the first metal nitride layer and/or the second metal nitride layer. Temperatures of at least 700° C. or at least 800° C. have been found to be advantageous for the growth since the mobility of atoms along the surface is increased. Temperatures of above 1000° C. have typically been found not to be necessary since good crystal quality is nevertheless achieved. Even higher temperatures can therefore advantageously be dispensed with, thereby saving energy and reducing the stress on components.

The invention further relates to a semiconductor assembly which has been produced by means of a method according to the invention. With respect to the method, it is possible to make use of all embodiments and variants described herein. The semiconductor assembly may in particular comprise a silicon substrate, a first metal nitride layer and a second metal nitride layer, wherein the first metal nitride layer is applied directly to the silicon substrate and the second metal nitride layer is applied directly to the first metal nitride layer.

According to a further embodiment, the semiconductor assembly may comprise a silicon substrate, a metal layer, a first metal nitride layer and a second metal nitride layer. The metal layer is typically applied here directly to the silicon substrate. The first metal nitride layer is typically applied directly to the metal layer. The second metal nitride layer is typically applied directly to the first metal nitride layer. As already described, particularly high crystal quality can be achieved in the case of semiconductor assemblies of this type by way of the production procedure according to the invention. In particular, particularly low roughness can be achieved on the now clear surface of the second metal nitride layer, which is advantageous for the growth of further semiconductor layers in which for example components such as power transistors, diodes, light-emitting diodes or solar cells can then be formed.

Plasma-assisted atomization or a sputtering process is typically effected at low pressure of a few pascals, for example at most 1 Pa, 2 Pa, 5 Pa, 10 Pa or 30 Pa, of the supplied sputtering gas via a plasma discharge. The sputtering gas is preferably highly pure, which can refer here for example to the described gases nitrogen, hydrogen, ammonia and/or one or more noble gases. A plasma is typically guided via magnets below a target or adjacent to the target, this also being referred to as magnetron sputtering. In particular, plasma-assisted atomization may be effected continuously or alternatively in a pulsed manner, with pulsed bipolar plasma-assisted atomization delivering better results in some cases. With a sufficient substrate temperature, usually below the temperatures typical in metal-organic gas phase epitaxy, i.e. for example up to at most 1000° C., and by way of the energy input of the sputtered ions, smooth monocrystalline layers can thus typically be deposited on a crystalline substrate. Silicon is therefore of particular interest as substrate material since it is available in large diameters at low cost.

It has been found that the method according to the invention may be carried out advantageously with an Si(111) orientation or an Si(110) orientation. This achieves particularly good results. However, other orientations are also possible. If an Si(110) orientation is used, it has been proven to be advantageous to use a substrate that is misoriented by at least 3°, in order to avoid crystals that are skewed by 90° or antiphase domains owing to monolayer steps.

By way of example, the following procedure may be used:
1. providing an oxide-free, crystalline silicon substrate,
2. heating the silicon substrate to 500° C. to 1,200° C.,
3. sputtering or plasma-assisted atomization of 0.05 to 1 nm of a metal in a non-reactive atmosphere,
4. sputtering or plasma-assisted atomization of 5 to 100 nm of metal nitride with $N_2/H_2$ ($N_2/H_2>0.8$) and a noble gas,
5. sputtering or plasma-assisted atomization of metal nitride with a noble gas and ammonia and/or a nitrogen-hydrogen mixture,
6. growing a metal-nitrogen layer or some other layer sequence using an epitaxy method.

In the case of direct use of ammonia or a nitrogen-hydrogen mixture with a proportion of hydrogen of >20% as reactive sputtering gas in step 4, it is not possible to form a well-oriented crystalline metal nitride. Although these layers are c-axis oriented ("tilted") for example when aluminum is used as metal, they are twisted significantly in the plane, which is manifested in a very high edge dislocation density. In particular, this may be because a silicon nitride layer is formed early on with this gas, this layer disrupting in-plane growth at an early stage. The process with nitrogen and a noble gas strongly suppresses this nitridation. The metal initially deposited in step 3 protects the surface against nitridation and initially leads, when nitrogen is made available from a plasma, generally to the dominant formation of metal nitride instead of SiN. The metal should in particular be deposited rapidly here at high substrate temperatures (ideally >700° C.), in particular when using aluminum, since from 577° C. alloying of aluminum and silicon can take place, i.e. the aluminum diffuses from the surface into silicon.

In the case of a slow process regime and very high temperatures, there should in particular be a tendency to choose a more generous nominal aluminum or metal thickness in order to counteract this inward diffusion process.

For example, a theoretical ideal thickness of the metal layer is about one monolayer, i.e. 0.2 nm to 0.3 nm, which is also confirmed experimentally. Ideally, the plasma-assisted atomization with nitrogen is effected in step 5 directly after the metal deposition in order to nitride the ideally highly reactive metal, which is preferably more reactive with nitrogen than with silicon, on the silicon surface, followed by a layer with a thickness sufficient to obtain a surface that is more than 50% closed. A rapid process regime is appropriate here in particular for plants with a high chamber base pressure, since a long interval between metal deposition and nitridation can lead to unwanted oxidation of the metal. This is typically followed in step 6 by growth with a hydrogen- and nitrogen-containing atmosphere or plasma discharge.

This may for example be effected by means of ammonia or a nitrogen-hydrogen mixture. A noble gas such as argon is usually also added here in order to adjust the proportion of the group V element and therefore the growth behavior. For example, more nitrogen tends to result in rougher growth, the lower limit typically resulting from inadequate stoichiometry which is also usually manifested in roughening of the surface. It is also possible here to supply hydrogen in addition to the ammonia, i.e. to set a nitrogen-hydrogen ratio of >1/3 or, when using nitrogen and hydrogen as sputtering gases, to set this directly through an $N_2/H_2$ ratio of >1/3. It has been found that particularly in certain situations ammonia delivers better results than a mixture of hydrogen and nitrogen. According to the current state of knowledge, hydrogen often has a positive effect on the surface mobility of the incoming atoms and molecules that have not yet been chemisorbed and therefore promotes smooth layers. However, the proportion of hydrogen should typically not be high during the initial plasma-assisted atomization on silicon, since it is probable in that case that the nitridation or roughening of silicon is promoted by way of the formation of Si-H compounds. $N_2/H_2$ ratios of >0.8, or better >0.9, are typically advantageous here, or the complete absence of hydrogen in the plasma-assisted atomization of the first nanometers of AlN, until larger, well-oriented crystals have formed and the surface of the silicon is mostly covered, i.e. ideally >90%, with AlN. There is otherwise the risk that strongly misoriented crystals will form, which cause lasting disruption to the later growth and the surface morphology.

After this layer, further (buffer) layers may be grown, for example such as AlGaN and GaN in the case of group III nitride epitaxy, and the active component layers may be sputtered or applied by means of MOVPE.

It has been found that for example with sapphire as substrate, sputtering with ammonia or a nitrogen-hydrogen mixture can be performed directly in step 3 with good results. However, it has also been found that this is not possible when using silicon as substrate, since it is not possible to achieve convincing results. It is only the procedure according to the invention that leads to correspondingly high-quality layers.

In order to obtain an oxide-free substrate (step 1), on the one hand preparation with a final HF or buffered HF (ammonium fluoride-hydrofluoric acid) step is advantageous, or heating in a vacuum, ideally with a hydrogen-containing plasma for surface cleaning. If heating to the temperature for step 3 has not already been performed in step 1, this is effected for example in a cooling or heating step in step 2.

The method is advantageous in respect of the layer quality obtained that, in X-ray diffraction, results in omega half-height widths for 200 nm-thick AlN layers of <0.5° for the (0002) reflection and significantly below 1° for the (1010) reflection, which are values that can only be obtained with difficulty with this layer thickness even in MOVPE. Layers or layer sequences deposited thereon (step 6) may then generally be deposited with further-improved layer quality, which benefits component performance.

Figure 2:
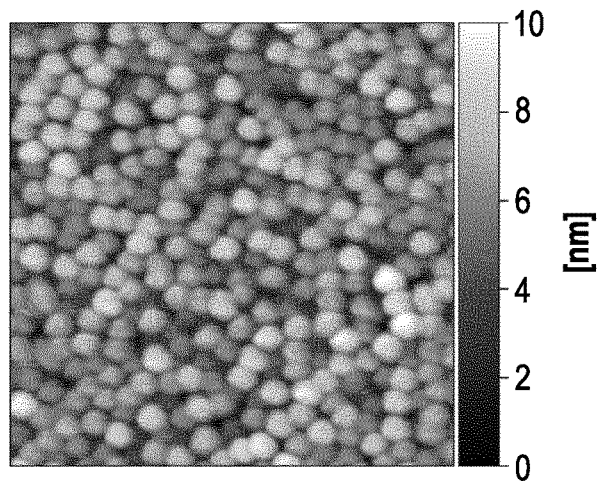
Figure 3:
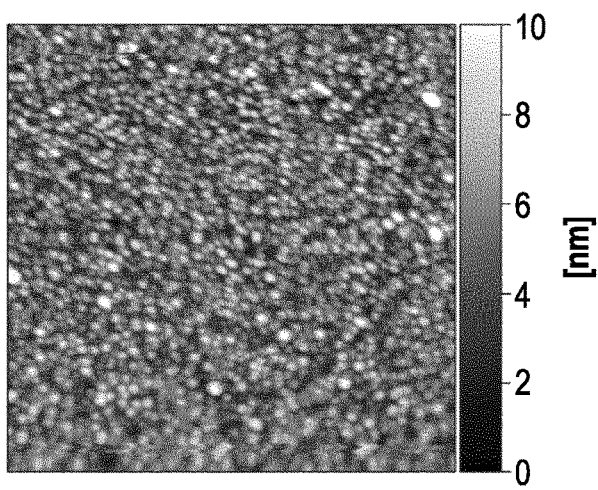
Figure 4:
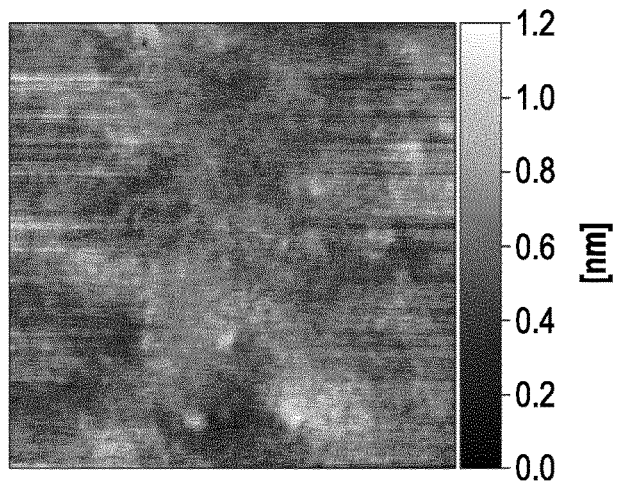

Further features and advantages will be inferred by those skilled in the art from the exemplary embodiments described below with reference to the appended drawing, in which:

FIG. 1: shows a semiconductor assembly,
FIG. 2: shows an AFM image of a metal nitride layer grown only with nitrogen,
FIG. 3: shows an AFM image of a metal nitride layer grown only with ammonia, and FIG. 4: shows an AFM image of a surface of a semiconductor assembly which has been produced by means of the method according to the invention.

FIG. 1 shows a semiconductor assembly 1 according to one exemplary embodiment of the invention. This involved first growing a metal layer 7, which in the present case is an aluminum layer and has a thickness of one monolayer, onto a silicon substrate 5. A first metal nitride layer 10 was grown onto the metal layer 7, and a second metal nitride layer 20 was in turn grown directly onto this first metal nitride layer 10. In the present case, the two metal nitride layers 10, 20 are aluminum nitride layers.

It should be mentioned that although aluminum is given as a specific exemplary embodiment here, it is also possible to instead use other metals such as titanium, a transition metal or a group III element or else a combination of two or more such metals.

By way of example, a process sequence for such a growth is now given as an exemplary embodiment. For this purpose, an Si(111) substrate 5 is first cleaned by means of cold diluted piranha solution and HF in a multistage process, as a result of which it is ideally hydrogen-terminated. It is then introduced into a sputtering chamber and heated to a temperature of 800° C. to 850° C. under a hydrogen-argon atmosphere with a partial pressure of about 5 Pa, in order to preserve the surface termination with hydrogen. Preliminary sputtering of an aluminum target is performed in the meantime. When the temperature is reached, apertures are opened and nominally about 0.2 nm to 0.4 nm of aluminum is deposited for a few seconds, this forming the metal layer 7. There is then ideally a direct change to an argon-nitrogen mixture for the sputtering, which represents a possible embodiment of the plasma-assisted atomization, and about 20 nm to 50 nm of AlN is sputtered, this forming the first metal nitride layer 10. This is followed by a change to an ammonia-argon mixture and the sputtering of a further 150 nm of AlN, this forming the second metal nitride layer 20.

Typically, the first metal nitride layer 10 is strongly columnar due to the sputtering in an $Ar/N_2$ mixture and therefore an interface 15 to the second metal nitride layer 20, which is grown in an $Ar/NH_3$ mixture, is comparatively rough, which can also be seen in atomic force microscope images which are described further down. Although directly growing an AlN layer on silicon in an $Ar/NH_3$ mixture results in a rough layer, as will be described in more detail further down with reference to FIG. 3, the growth on the first metal nitride layer 10 then in turn has a smoothing effect, with the result that the surface appears with a very low roughness in the region of atomic layer thicknesses. This is caused by increased lateral growth of the AlN, which is also reflected by the fact that strongly misoriented crystals which occasionally occur in the first metal nitride layer 10 are laterally overgrown and cavities 17 that taper toward the surface can form, as seen for example in transmission electron microscope images of the cross section of the layer. The roughness when growing directly onto silicon is very probably due to the nitridation, enhanced by ammonia, of the silicon at the beginning of the layer growth and the crystal nuclei that are poorly oriented as a result.

During the sputtering with the argon-nitrogen mixture, i.e. when growing the first metal nitride layer 10, it is also even possible to add a small amount of for example less than 10% or less than 20% (based on the number of atoms) of hydrogen; however, this should preferably be moderate enough that it does not promote the formation of SiN. However, adding a small amount can improve the quality of the AlN.

These layers then serve as a base for the growth of thicker buffer layers, i.e. the desired epitaxy of the component layer sequences. The AlN serves to protect the silicon from the Ga of the GaN and the unwanted meltback etching reaction that occurs here.

In a second exemplary embodiment that is not shown, as an alternative, TiN can for example first be sputtered analogously to the AlN, and AlN in the wurtzite phase can in turn be grown on the TiN that is in the sodium chloride phase. Alternatively, AlTiN with a different composition, ideally in the wurtzite phase, can also be sputtered. The advantage of using Ti(Al)N or other metals such as Hf(Al)N is better lattice adaptation and thus a higher achievable layer quality. The notation of the element Al in parentheses means that this is only added optionally. Alternatively, it is also possible to add other metals such as In in the first layer in small amounts and later also Ga or any other metal in larger amounts. The aim of the buffer layer is for example to provide a suitable nitride layer for the subsequent growth. In the case of subsequent group III nitride growth, this is preferably a wurtzitic layer or another crystalline modification oriented in such a way that a wurtzitic crystal of high quality can be grown thereon. For the subsequent growth of group III nitride layers, a material which has a lower lattice parameter or atomic distance than the following layer is ideally used. This helps for example to counteract resulting tensile stresses in the layer on silicon during cooling, in order to obtain a flat wafer or to obtain a crack-free III-N layer.

Further layers may be applied by the method according to the invention to the second metal nitride layer 20, which may also be referred to as metal-nitrogen buffer layer and which may for example be formed from AlN or TiAlN. For example, for many GaN-based components first an AlGaN buffer is applied with increasing GaN content, in order to improve the tension management of the layers, followed by a GaN buffer. By way of example in the case of an LED structure, this is typically followed by an n-conducting GaN layer, an n-conducting InGaN layer with a thickness of more than 20 nm and with an In content of <5%, and then the active layer consisting of a quintuple sequence of about 3 nm of InGaN followed by a GaN or InGaN barrier with a lower, in particular significantly lower, In content and with a thickness of more than 5 nm. This is followed by an Mg-doped AlGaN injection barrier that is about 5 nm to 30 nm thick, and then Mg-doped p-GaN as contact layer. A light-emitting diode (LED) can thus for example be produced by means of photolithography, metallization and possibly the application of TCOs and isolating layers, and the removal of the absorbing Si substrate. The group III-N layers above the second metal nitride layer 20 may be grown here by means of common methods such as MOVPE or MBE; however, they may also be grown by sputter epitaxy.

The application according to the invention can be demonstrated in the crystalline characteristics, for example in a transmission electron microscope or scanning electron microscope. Here, in addition to a metal nitride-silicon interface with little perturbation, there is also a division of the metal nitride layer in two as a result of the different degrees of growth under nitrogen and ammonia in the case of most materials. More significant columnar growth tends to be seen with nitrogen than with ammonia, and hence also a rough interface, or a structure that can be interpreted as a perturbation, and quite a smooth upper interface.

As in the case of TiAlN, in principle all ternary, quaternary or other material combinations can be sputtered. All possible materials, i.e. not only group III nitride layers, can also be grown on this buffer provided that the crystal orientation of the buffer, and the lattice mismatch, are suitable for this. However, it is advantageous for the initial metal layer on the silicon to use a metal that reacts strongly with nitrogen and on the other hand does not diffuse into the silicon too quickly. In addition to the sputtering method, it is also possible to use pulsed laser deposition or pulsed laser epitaxy or other metal-atomizing methods that work with a reactive atmosphere.

FIG. 2 shows an image from an atomic force microscope (AFM) of a surface of an aluminum nitride layer grown only with nitrogen as process gas. A 1 µm×1 µm section is shown here. A scale is given on the right which shows the height in nanometers. This also applies to FIGS. 3 and 4 described hereinafter.

As can be seen in FIG. 2, the difference between highest and lowest points is about 10 nm, with a visible pronounced granulation of the surface.

This surface is thus for example the surface of the first metal nitride layer 10, which was discussed further up with reference to FIG. 1.

FIG. 3 shows a corresponding image from an atomic force microscope of an aluminum nitride layer grown exclusively with ammonia as process gas. This thus practically corresponds to the case where the second metal nitride layer 20 from FIG. 1 is grown directly on the metal layer 7, without the first metal nitride layer 10 being grown beforehand. The granulation here is finer, although a difference between highest and lowest points of about 10 nm can also be observed here.

FIG. 4 shows an image from an atomic force microscope of a surface of a semiconductor assembly 1 according to the invention which has thus been grown by means of the method according to the invention. For example, this may be the upward-facing surface of the semiconductor assembly 1 of FIG. 1. It can be seen here that clear granulation is no longer apparent and the difference between highest and lowest points is only about 1.2 nm.

Compared to the alternative embodiments in which only one layer is grown with ammonia or nitrogen as process gas, the use of the two metal nitride layers 10, 20 according to the inventive embodiment therefore makes it possible to achieve a reduction in roughness perpendicular to the surface by about a factor of 10. Whereas an average roughness (RMS=root mean square) of 1.5 nm was determined in FIGS. 2 and 3, only an average roughness of 0.14 nm is determined in FIG. 4. The significantly reduced roughness provides a much better basis for the growth of further semiconductor layers, the quality of which can therefore be considerably improved. A similar or better quality can therefore be achieved by way of sputtering methods compared to when metal-organic gas phase epitaxy is used directly.

Mentioned steps of the method according to the invention may be performed in the order indicated. However, they may also be performed in a different order, if this is technically appropriate. In one of its embodiments, for example with a specific combination of steps, the method according to the invention may be performed in such a way that no further steps are carried out. However, in principle, further steps may also be performed, even steps that have not been mentioned.

It should be pointed out that features may be described in combination in the claims and in the description, for example in order to facilitate understanding, even though these may also be used separately from one another. Those skilled in the art will recognize that such features may also independently of one another be combined with other features or feature combinations.

Dependency references in dependent claims may characterize preferred combinations of the respective features, but do not exclude other feature combinations.

LIST OF REFERENCE SIGNS

1: semiconductor assembly
5: silicon substrate
7: metal layer
10: first metal nitride layer
15: interface
17: cavities
20: second metal nitride layer

The invention claimed is:

1. A method for growing a semiconductor assembly, wherein the method comprises:
providing a silicon substrate,
growing a first metal nitride layer on the silicon substrate by way of plasma-assisted atomization via at least one metal target and a first plasma which is generated by supplying a first gas feed comprising at least nitrogen, and
growing a second metal nitride layer directly on the first metal nitride layer by way of plasma-assisted atomization via at least one metal target and a second plasma which is generated by supplying a second gas feed comprising at least nitrogen or ammonia,
wherein the second gas feed for growing the second metal nitride layer has a higher ratio of hydrogen atoms to nitrogen atoms than the first gas feed for growing the first metal nitride layer.

2. The method as claimed in claim 1,
which, before the growing of the first metal nitride layer, comprises:
growing a metal layer directly on the silicon substrate by way of plasma-assisted atomization via at least one metal target,
wherein the first metal nitride layer is grown directly on the metal layer.

3. The method as claimed in claim 2,
wherein the metal layer has a thickness of at least 0.2 nm and at most 1 nm, and
wherein the metal layer is grown as an aluminum layer or as a titanium layer.

4. The method as claimed in claim 1,
wherein the first gas feed comprises nitrogen and hydrogen,
wherein a stoichiometric ratio between hydrogen atoms and nitrogen atoms is at most 0.2.

5. The method as claimed in claim 1,
wherein the first gas feed comprises nitrogen, but does not comprise hydrogen.

6. The method as claimed in claim 1,
wherein the second gas feed comprises ammonia.

7. The method as claimed in claim 1,
wherein the second gas feed comprises nitrogen and hydrogen,
wherein the stoichiometric ratio between hydrogen atoms and nitrogen atoms is at least 0.2, and at most 4.

8. The method as claimed in claim 1,
wherein the second gas feed comprises nitrogen, ammonia and hydrogen,
wherein a stoichiometric ratio between hydrogen atoms and nitrogen atoms is at least 0.2, and at most 4.

9. The method as claimed in claim 4,
wherein the first gas feed comprises no further gas, or
wherein the first gas feed further comprises only one or more noble gases;
and/or
wherein the second gas feed comprises no further gas, or
wherein the second gas feed further comprises only one or more noble gases.

10. The method as claimed in claim 1,
wherein the first metal nitride layer is grown with a thickness of at least 3 nm and at most 150 nm.

11. The method as claimed in claim 1,
wherein the second metal nitride layer is grown with a thickness of at least 10 nm and at most 2 μm.

12. The method as claimed in claim 1,
wherein one or more further semiconductor layers are grown directly on the second metal nitride layer.

13. The method as claimed in claim 1,
wherein the metal used for the first metal nitride layer is aluminum, titanium, a transition metal, a group III element or a combination of two or more of these metals;
and/or
wherein the metal used for the second metal nitride layer is aluminum, titanium, a transition metal, a group III element or a combination of two or more of these metals.

14. The method as claimed in claim 1,
wherein the silicon substrate is provided in oxide-free and/or hydrogen-terminated form;
and/or
wherein the silicon substrate is heated during the growing to a temperature of at least 700° C. and at most 1,000° C.

15. A semiconductor assembly which has been produced via a method as claimed in claim 1.

16. The method as claimed in claim 5,
wherein the first gas feed comprises no further gas, or
wherein the first gas feed further comprises only one or more noble gases;
and/or
wherein the second gas feed comprises no further gas,
wherein the second gas feed further comprises only one or more noble gases.

17. The method as claimed in claim 6,
wherein the first gas feed comprises no further gas, or
wherein the first gas feed further comprises only one or more noble gases;
and/or
wherein the second gas feed comprises no further gas, or
wherein the second gas feed further comprises only one or more noble gases.

18. The method as claimed in claim 7,
wherein the first gas feed comprises no further gas, or
wherein the first gas feed further comprises only one or more noble gases;
and/or
wherein the second gas feed comprises no further gas, or
wherein the second gas feed further comprises only one or more noble gases.

19. The method as claimed in claim 8,
wherein the first gas feed comprises no further gas, or
wherein the first gas feed further comprises only one or more noble gases;
and/or
wherein the second gas feed comprises no further gas, or
wherein the second gas feed further comprises only one or more noble gases.

* * * * *